(12) United States Patent
Yoshikawa et al.

(10) Patent No.: US 9,972,756 B2
(45) Date of Patent: May 15, 2018

(54) METHOD FOR PRODUCING SEMICONDUCTOR LIGHT-EMITTING DEVICE

(71) Applicant: Sumitomo Chemical Company, Limited, Tokyo (JP)

(72) Inventors: Gaku Yoshikawa, Osaka (JP); Masayuki Takashima, Osaka (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days. days.

(21) Appl. No.: 15/112,449

(22) PCT Filed: Jan. 20, 2015

(86) PCT No.: PCT/JP2015/051943
§ 371 (c)(1),
(2) Date: Jul. 19, 2016

(87) PCT Pub. No.: WO2015/115341
PCT Pub. Date: Aug. 6, 2015

(65) Prior Publication Data
US 2016/0336493 A1    Nov. 17, 2016

(30) Foreign Application Priority Data

Jan. 31, 2014    (JP) .................................. 2014-016590

(51) Int. Cl.
*H01L 33/00*    (2010.01)
*H01L 33/52*    (2010.01)
(Continued)

(52) U.S. Cl.
CPC ............ *H01L 33/52* (2013.01); *H01L 23/296* (2013.01); *H01L 33/56* (2013.01); *H01L 33/486* (2013.01);
(Continued)

(58) Field of Classification Search
CPC ........ H01L 33/52; H01L 33/56; H01L 23/296
See application file for complete search history.

(56) References Cited

U.S. PATENT DOCUMENTS

| 6,765,801 | B1* | 7/2004 | Glenn | ..................... H01S 5/022 174/535 |
| 2004/0178509 | A1* | 9/2004 | Yoshino | .................. C08L 83/04 257/780 |
| 2012/0267651 | A1 | 10/2012 | Kim et al. | |

FOREIGN PATENT DOCUMENTS

| CN | 102760386 A | 10/2012 |
| EP | 2065931 A1 | 6/2009 |

(Continued)

OTHER PUBLICATIONS

Int'l Search Report dated Mar. 10, 2015 in Int'l Application No. PCT/JP2015/051943 (English Translation).

(Continued)

*Primary Examiner* — Jesse Y Miyoshi
*Assistant Examiner* — John Lin
(74) *Attorney, Agent, or Firm* — Panitch Schwarze Belisario Belisario & Nadel LLP

(57) ABSTRACT

A method for producing a semiconductor light-emitting device having a substrate, an element and an encapsulating material as constituent members, includes: a first step of providing the substrate with the element; a second step of potting an uncured encapsulating material onto the substrate to cover the element; and a third step of curing the potted encapsulating material in such a manner that all of the following formulae (1), (2) and (3) are satisfied when the absorbances which a cured encapsulating material having a thickness of t [nm] has at wavelengths of 380 nm, 316 nm and 260 nm are represented by $Abs_A(t)$, $Abs_B(t)$ and $Abs_C(t)$, respectively, and the light transmittance thereof at 380 nm is (Continued)

represented by T(t): (1) $T(1.7) \geq 90\%$; (2) $Abs_B(t)-Abs_A(t) < 0.011t$; and (3) $Abs_C(t)-Abs_A(t) < 0.125t$.

7 Claims, 2 Drawing Sheets

(51) Int. Cl.
  *H01L 23/29* (2006.01)
  *H01L 33/56* (2010.01)
  *H01L 33/48* (2010.01)

(52) U.S. Cl.
  CPC ............ *H01L 2224/16225* (2013.01); *H01L 2224/45144* (2013.01); *H01L 2224/48227* (2013.01); *H01L 2224/48237* (2013.01); *H01L 2924/181* (2013.01); *H01L 2933/005* (2013.01)

(56) References Cited

FOREIGN PATENT DOCUMENTS

| | | |
|---|---|---|
| JP | 2013124324 A | 6/2013 |
| JP | 2013222746 A | 10/2013 |

OTHER PUBLICATIONS

Int'l Preliminary Report on Patentability dated Aug. 2, 2016 in Int'l Application No. PCT/JP2015/051943 (English Translation).
Extended Search Report dated May 31, 2017 in EP Application No. 15743494.5.
Office Action dated Oct. 11, 2017 in CN Application No. 201580005558.1 with English Translation.
Office Action dated Dec. 25, 2017 in TW Application No. 104102547.

\* cited by examiner

US 9,972,756 B2

METHOD FOR PRODUCING SEMICONDUCTOR LIGHT-EMITTING DEVICE

CROSS-REFERENCE TO RELATED APPLICATION

This application is a Section 371 of International Application No. PCT/JP2015/051943, filed Jan. 20, 2015, which was published in the Japanese language on Aug. 6, 2015, under International Publication No. WO 2015/115341 A1, and the disclosure of which is incorporated herein by reference.

TECHNICAL FIELD

The present invention relates to a method for producing a semiconductor light-emitting device.

BACKGROUND ART

As a method for producing a semiconductor light-emitting device, there is known, for example, a producing method involving encapsulating an element, comprising a step of providing the substrate with the element, a step of potting an uncured encapsulating material onto the substrate to cover the element, and a step of curing the potted uncured encapsulating material (Non-Patent Document 1).

PRIOR ART DOCUMENT

Non-Patent Document

Non-Patent Document 1: "Silicone Catalog For Electronics" issued in October, 2010 on the Internet by Dow Corning Toray Co., Ltd.
<URL: http://www.dowcorning.co.jp/ja_JP/content/japan/japanproducts/Electronics-Silicone-Catalog2010.pdf>

DISCLOSURE OF THE INVENTION

Problems to be Solved by the Invention

However, in the conventional producing methods, the encapsulating material has a high absorbance of ultraviolet light, in particular, light in the UV-C (200-280 nm) range, and also the absorbed ultraviolet light causes deterioration of the encapsulating material, so that the conventional producing methods have not necessarily been suitable for producing a semiconductor light-emitting device comprising an element which emits ultraviolet light in such a range.

Means for Solving the Problems

The present invention includes the following inventions [1] to [7]:

[1] a method for producing a semiconductor light-emitting device comprising a substrate, an element and an encapsulating material as constituent members, comprising
  a first step of providing the substrate with the element;
  a second step of potting an uncured encapsulating material onto the substrate to cover the element; and
  a third step of curing the potted encapsulating material in such a manner that all of the following formulae (1), (2) and (3) are satisfied when the absorbances which a cured encapsulating material having a thickness of t [mm] has at wavelengths of 380 nm, 316 nm and 260 nm are represented by $Abs_A(t)$, $Abs_B(t)$ and $Abs_C(t)$, respectively and the light transmittance thereof at 380 nm is represented by $T(t)$:

$$T(1.7) \geq 90\% \quad (1)$$

$$Abs_B(t) - Abs_A(t) < 0.011t \quad (2)$$

$$Abs_C(t) - Abs_A(t) < 0.125t \quad (3);$$

[2] the producing method according to [1], wherein the formula (3) is the following formula (3'):

$$Abs_C(t) - Abs_A(t) < 0.09t \quad (3');$$

[3] the producing method according to claim 1 or 2, wherein t exceeds the thickness [mm] of the element and is 2 or less;

[4] the producing method according to any one of [1] to [3], wherein all of the following formulae (4) and (5) are satisfied when the absorbances detected in infrared-spectroscopically measuring a raw material contained in the uncured encapsulating material to be used in the second step at wavenumbers of 1269 $cm^{-1}$, 3300 $cm^{-1}$, 1016 $cm^{-1}$ and 1090 $cm^{-1}$ are represented by a, b, c and d, respectively:

$$0.6 < d/c < 0.8 \quad (4)$$

$$0 < b/a < 0.4 \quad (5);$$

[5] the producing method according to any one of [1] to [4], wherein the encapsulating material comprises a polycondensation type encapsulating material;

[6] a semiconductor light-emitting device produced by the producing method according to [1], wherein all of the following formulae (1), (2) and (3) are satisfied when the absorbances which the cured encapsulating material having a thickness of t [mm] has at wavelengths of 380 nm, 316 nm and 260 nm are represented by $Abs_A(t)$, $Abs_B(t)$ and $Abs_C(t)$, respectively and the light transmittance thereof at 380 nm is represented by $T(t)$:

$$T(1.7) \geq 90\% \quad (1)$$

$$Abs_B(t) - Abs_A(t) < 0.011t \quad (2)$$

$$Abs_C(t) - Abs_A(t) < 0.125t \quad (3); \text{ and}$$

[7] the semiconductor light-emitting device according to [6], wherein the element is an element which emits light in the UV-C (200-280 nm) range.

Effect of the Invention

By the producing method of the present invention, there can be produced a semiconductor light-emitting device exhibiting a good efficiency of extracting ultraviolet light, in particular, light in the UV-C (200-280 nm) range, and causing little deterioration of an encapsulating material.

MODE FOR CARRYING OUT THE INVENTION

Hereinafter, the present invention will be explained in detail. A semiconductor light-emitting device produced by the producing method of the present invention comprises a substrate, an element and an encapsulating material as constituent members.

<Substrate>

Figure 1:
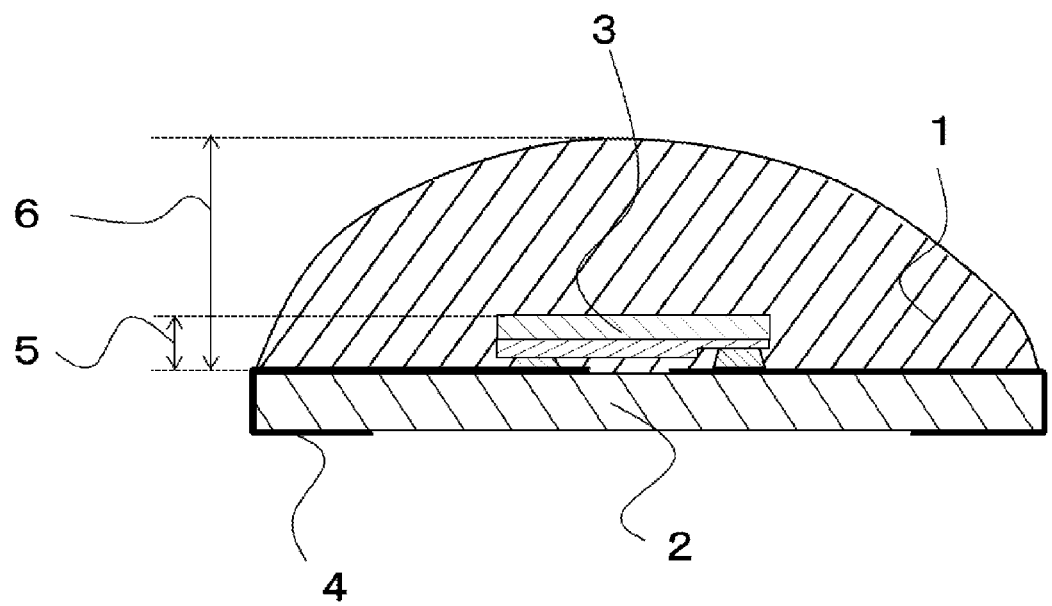
FIG. 1 is a model view of a flip-chip type and COB type semiconductor light-emitting device produced by the producing method of the present invention.
Figure 2:
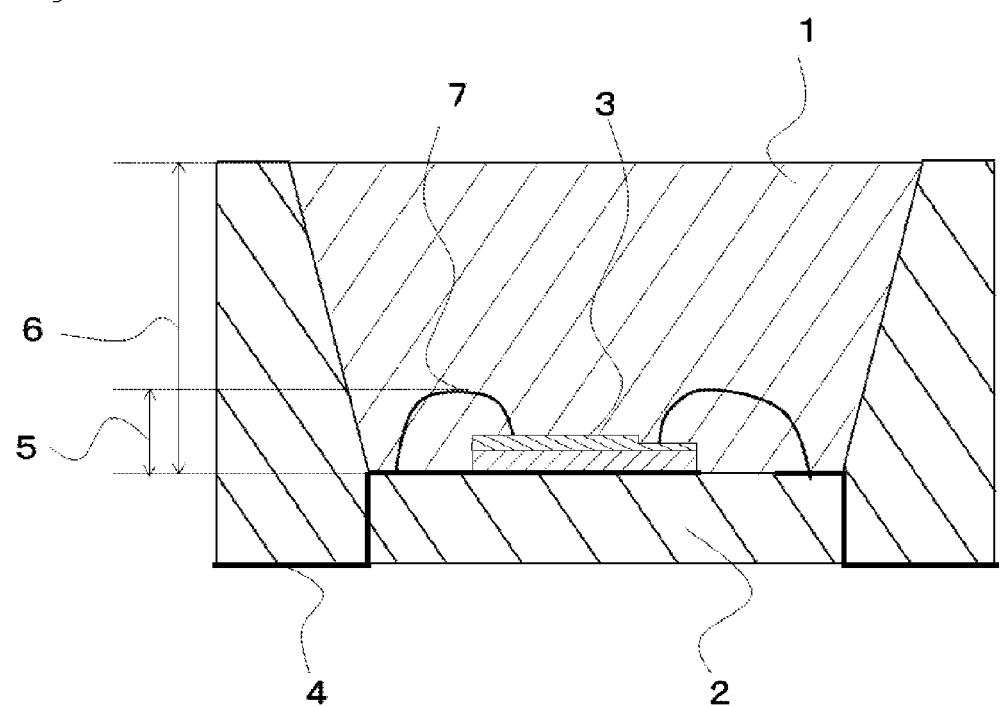
FIG. 2 is a model view of a face-up type and SMD type semiconductor light-emitting device produced by the producing method of the present invention.

The substrate only needs to be one which is generally used as a substrate of a semiconductor light-emitting device. For example, a substrate made of a resin such as nylon, epoxy or LCP, or made of a ceramic such as alumina, aluminum nitride or LTCC is used as the substrate. In particular, when an element which emits ultraviolet light is used, a ceramic is often used in order to suppress coloring deterioration of the substrate. As the shape thereof, a configuration in which an element is disposed on a flat-plane substrate as shown in FIG. 1, a configuration in which a reflector is further disposed in order to enhance the light extraction efficiency as shown in FIG. 2, or the like is used.

Typically, an electrode is provided on the substrate in order to establish electrical connection to the element which is to be mounted.

<Element>

The element only needs to be one which is generally used as a semiconductor light-emitting element. For example, a blue light-emitting diode, a red light-emitting diode, a green light-emitting diode, a white light-emitting diode, and an ultraviolet light-emitting diode which are generally referred to as LEDs can be mentioned. These LEDs are produced, for example, by growing a Group III-V semiconductor such as AlInGaP, InGaN or AlGaN on sapphire, aluminum nitride or the like by the MOCVD method. AlGaN is preferably used as the semiconductor contained in an element for ultraviolet light emission of 360 nm or less. One or a plurality of elements is disposed on one substrate. Regarding the provision of the element, a flip-chip type in which the MOCVD growth surface is let to face the substrate side or a face-up type in which the MOCVD growth surface is let to face in the reverse direction is used. In the case of the flip-chip type, the element is electrically connected to the electrode on the substrate by a solder. In the case of the face-up type, the element is electrically connected to the electrode by using a wire interconnect such as gold. In the case of an ultraviolet LED, the flip-chip type is often used in view of light extraction.

<Encapsulating Material>

In the present invention, the encapsulating material typically comprises at least one kind of an encapsulating material selected from the group consisting of addition polymerization type encapsulating materials and polycondensation type encapsulating materials. The addition polymerization type encapsulating material is an encapsulating material which is polymerized by allowing a hydrosilyl group to undergo addition reaction to a carbon-to-carbon double bond. The polycondensation type encapsulating material is an encapsulating material which is produced by polycondensation of a hydroxyl group which is bonded to a silicon atom and an alkoxy group or a hydroxyl group which is bonded to another silicon atom with dealcoholization or dehydration involved.

In view of ultraviolet visible transmittance, the encapsulating material preferably comprises a polycondensation type encapsulating material. The polycondensation type encapsulating material substantially does not comprise a carbon-to-carbon bond having a comparatively weak bonding force and hence is preferable also from the viewpoint of deterioration caused by ultraviolet light. When the encapsulating material comprises two or more kinds of encapsulating materials, these encapsulating materials may be mixed for use in the later-mentioned second step. For example, the encapsulating materials may be used in a stepwise manner comprising a second step of potting a first kind of uncured encapsulating material onto the substrate to cover the element, a third step of curing the potted first kind of uncured encapsulating material, and a step of laminating an encapsulating material by potting a second kind of uncured encapsulating material onto the cured first kind of encapsulating material which covers the element and curing the potted second kind of uncured encapsulating material.

It is preferable that all of the following formulas (4) and (5) are satisfied when the absorbances detected in infrared-spectroscopically measuring a raw material contained in the uncured encapsulating material at wavenumbers of 1269 $cm^{-1}$, 3300 $cm^{-1}$, 1016 $cm^{-1}$ and 1090 $cm^{-1}$ are represented by a, b, c and d, respectively:

$$0.6 < d/c < 0.8 \tag{4}$$

$$0 < b/a < 0.4 \tag{5}$$

The raw material contained in the uncured encapsulating material typically refers to an encapsulating material contained in the largest amount when the encapsulating material comprises, for example, two or more kinds of encapsulating materials, and it is sufficient that this satisfies all of the above formulas (4) and (5). It is preferable that the encapsulating materials which are put to use satisfy the above formulas (4) and (5) as a whole.

The uncured encapsulating materials are each preferably used by being dissolved in a solvent in order to facilitate the potting in the later-mentioned second step. At this time, it is good to make an adjustment so that the viscosity of an obtained solution at 25° C. may become 10 mPa·s to 10000 mPa·s.

The solvent only needs to be one which can respectively dissolve the uncured encapsulating materials which are put to use, and examples thereof include ketone solvents such as acetone and methyl ethyl ketone; alcohol solvents such as methanol, ethanol, isopropyl alcohol and normal propyl alcohol; hydrocarbon solvents such as hexane, cyclohexane, heptane and benzene; acetate solvents such as methyl acetate and ethyl acetate; ether solvents such as diethyl ether and tetrahydrofuran; glycol ether solvents such as ethylene glycol monomethyl ether, ethylene glycol monoethyl ether, ethylene glycol monoisopropyl ether, ethylene glycol monobutyl ether, ethylene glycol monohexyl ether, ethylene glycol monoethylhexyl ether, ethylene glycol monophenyl ether, ethylene glycol monobenzyl ether, diethylene glycol monomethyl ether, diethylene glycol monoethyl ether, diethylene glycol monoisopropyl ether, diethylene glycol monobutyl ether, diethylene glycol monohexyl ether, diethylene glycol monoethylhexyl ether, diethylene glycol monophenyl ether, diethylene glycol monobenzyl ether, propylene glycol monomethyl ether, propylene glycol monoethyl ether, propylene glycol monoisopropyl ether, propylene glycol monobutyl ether, propylene glycol monohexyl ether, propylene glycol monoethylhexyl ether, propylene glycol monophenyl ether, propylene glycol monobenzyl ether, dipropylene glycol monomethyl ether, dipropylene glycol monoethyl ether, dipropylene glycol monoisoproyl ether, dipropylene glycol monobutyl ether, dipropylene glycol monohexyl ether, dipropylene glycol monoethylhexyl ether, dipropylene glycol monophenyl ether and dipropylene glycol monobenzyl ether; and glycol ester solvents produced by adding an acetic acid group to the glycol ether solvents mentioned above, such as ethylene glycol monoethyl ether acetate, ethylene glycol monoisopropyl ether acetate, ethylene glycol monobutyl ether acetate, ethylene glycol monohexyl ether acetate, ethylene glycol monoethylhexyl ether acetate, ethylene glycol monophenyl ether acetate and ethylene glycol monobenzyl ether acetate.

As an example of the above encapsulating material, an encapsulating material comprising a resin A having an organopolysiloxane structure represented by the formula (I) can be mentioned. Such an encapsulating material is preferably solid at 25° C.

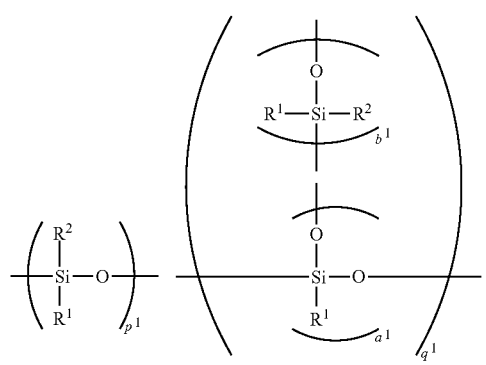

(I)

(In the formula, $R^1$ each independently represents an alkyl group; $R^2$ each independently represents an alkoxy group, an alkenyl group, a hydrogen atom or a hydroxyl group; and $p^1$, $q^1$, $a^1$ and $b^1$ represent positive numbers satisfying $[p^1+b^1 \times q^1]$ : $[a^1 \times q^1]$=1:0.25 to 9.)

Further, it is more preferable that the encapsulating material comprises an oligomer B having an organopolysiloxane structure represented by the formula (II), and a mixing ratio of the resin A and the oligomer B is resin A:oligomer B=100:0.1 to 20 (mass ratio). By comprising the resin A as a major component, the encapsulating material provided an effect of suppressing deterioration caused by ultraviolet light and improving heat resistance.

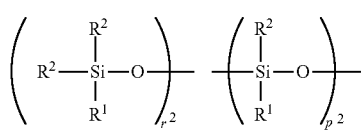

(II)

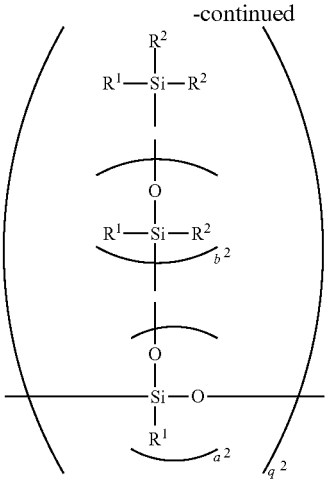

(In the formula, $R^1$ and $R^2$ represent the same meaning as in the formula (I); and $p^2$, $q^2$, $r^2$, $a^2$ and $b^2$ represent numbers equal to or larger than 0 satisfying $[a^2 \times q^2]/[(p^2+b^2 \times q^2)+a^2 \times q^2+(r^2+q^2)]$=0 to 0.3.)

The alkyl group represented by $R^1$ may be in a straight-chain form or a branched-chain form, or may have a cyclic structure. An alkyl group in a straight-chain form or a branched-chain form is preferable, and an alkyl group in a straight-chain form is more preferable. The number of carbon atoms in the alkyl group is not limited. The number is preferably 1 to 10, more preferably 1 to 6, further more preferably 1 to 3, and particularly preferably 1.

$R^2$ each independently represents an alkoxy group, an alkenyl group, a hydrogen atom or a hydroxyl group. Preferably, $R^2$ represents an alkoxy group or a hydroxyl group.

When $R^2$ is an alkoxy group, the alkoxy group may be in a straight-chain form or a branched-chain form, or may have a cyclic structure. An alkoxy group in a straight-chain form or a branched-chain form is preferable, and an alkoxy group in a straight-chain form is more preferable. The number of carbon atoms in the alkoxy group is not limited. The number is preferably 1 to 3, more preferably 1 to 2, and particularly preferably 1.

When $R^2$ is an alkenyl group, the alkenyl group may be in a straight-chain form or a branched-chain form, or may have a cyclic structure. An alkenyl group in a straight-chain form or a branched-chain form is preferable, and an alkenyl group in a straight-chain form is more preferable. The number of carbon atoms in the alkenyl group is not limited. The number is preferably 2 to 4. Specific preferable examples of the alkenyl group represented by $R^1$ include vinyl group (ethenyl group), allyl group (2-propenyl group), 1-propenyl group, isopropenyl group and butenyl group, among which a vinyl group is more preferable.

The plurality of $R^1$ and $R^2$ may each be the same kind of a group or may be groups which are different from each other.

The resin A is preferably a resin having, as $R^1$, one or more kinds selected from the group consisting of a methyl group and an ethyl group, and having, as $R^2$, one or more kinds selected from the group consisting of a methoxy group, an ethoxy group, an isopropoxy group and a hydroxyl group. The resin A is more preferably a resin having, as $R^1$, one or more kinds selected from the group consisting of a methyl group and an ethyl group, and having, as $R^2$, a hydroxyl group and one or more kinds selected from the group consisting of a methoxy group, an ethoxy group and an isopropoxy group.

The weight-average molecular weight (Mw) of the resin A is typically 1500 to 8000. When the weight-average molecular weight of the resin A satisfies such a range, the moldability of the cured product is improved. The weight-average molecular weight of the resin A is preferably 1500 to 7000, more preferably 2000 to 5000.

The resin A can be synthesized, for example, by using, as a starting material, an organic silicon compound corresponding to each of the aforementioned repeating units and having a functional group capable of generating a siloxane bond. The "functional group capable of generating a siloxane bond" may be, for example, a halogen atom, a hydroxyl group or an alkoxy group. The organic silicon compound may be, for example, organotrihalosilane or organotrialkoxysilane. The resin A can be synthesized through reaction by the hydrolysis condensation method using these starting materials in a ratio corresponding to an existence ratio of each repeating unit. As the resin A, it is also possible to use a resin which is industrially commercially available as a silicone resin, an alkoxy oligomer or the like.

The oligomer B is preferably an oligomer having, as $R^1$, one or more kinds selected from the group consisting of a methyl group and an ethyl group, and having, as $R^2$, one or more kinds selected from the group consisting of a methoxy group, an ethoxy group, an isopropoxy group and a hydroxyl group. The oligomer B is more preferably an oligomer having a methyl group as $R^1$ and having a methoxy group or a hydroxyl group as $R^2$.

The weight-average molecular weight of the oligomer B is typically less than 1500. When the weight-average molecular weight of the oligomer B satisfies such a range, the moldability of the cured product is improved. The weight-average molecular weight of the oligomer B is preferably 200 or more and less than 1500, more preferably 250 to 1000.

The oligomer B can be synthesized, for example, by using, as a starting material, an organic silicon compound corresponding to each of the aforementioned repeating units constituting the oligomer B and having a functional group capable of generating a siloxane bond. The "functional group capable of generating a siloxane bond" represents the same meaning as the one described above. For example, the organic silicon compound may be organotrihalosilane or organotrialkoxysilane. The oligomer B can be synthesized through reaction by the hydrolysis condensation method using these starting materials in a ratio corresponding to an existence ratio of each repeating unit.

The difference in weight-average molecular weight from the resin A can also be controlled, for example, by controlling the reaction temperature in subjecting the starting materials to hydrolysis condensation reaction or the speed of adding the starting materials into the reaction system. As the oligomer B, it is also possible to use an oligomer which is industrially commercially available as a silicone resin, an alkoxy oligomer, or the like.

The weight-average molecular weights of the resin A and the oligomer B can be measured by using a commercially available GPC apparatus and using polystyrene as a standard.

Such a preferable polycondensation-type encapsulating material preferably further comprises a catalyst for curing. When the catalyst for curing is used, it is preferable that the resin A and the oligomer B are prepared as separate solutions, and these solutions are mixed before use.

As the catalyst for curing, it is possible to use an inorganic acid such as hydrochloric acid, sulfuric acid, nitric acid or phosphoric acid, or an organic acid such as formic acid, acetic acid, oxalic acid, citric acid, propionic acid, butyric acid, lactic acid or succinic acid. It is also possible to use an alkaline compound besides an acidic compound. Specifically, ammonium hydroxide, tetramethylammonium hydroxide, tetraethylammonium hydroxide or the like can be used as well.

<Method for Producing Semiconductor Light-Emitting Device>

A producing method of the present invention will be described with reference to FIG. 1. The producing method includes:

a first step of providing a substrate 2 on which an electrode 4 has been provided with an element 3;

a second step of potting an uncured encapsulating material onto the substrate to cover the element; and a third step of curing the potted encapsulating material in such a manner that all of the following formulas (1), (2), and (3) are satisfied when the absorbances which a cured encapsulating material having a thickness of t [mm] has at wavelengths of 380 nm, 316 nm and 260 nm are represented by $Abs_A(t)$, $Abs_B(t)$ and $Abs_C(t)$, respectively and the light transmittance thereof at 380 nm is represented by T(t):

$$T(1.7) \geq 90\% \tag{1}$$

$$Abs_A(t) - Abs_A(t) < 0.011t \tag{2}$$

$$Abs_C(t) - Abs_A(t) < 0.125t \tag{3}$$

The first step is a step of providing the substrate with the element by an ordinary method. Other constituent members which are usually needed in the semiconductor light-emitting device, such as an electrode and an interconnect, may be provided as well.

The second step is a step of potting the uncured encapsulating material to cover the element provided on the substrate.

Typically, in the potting step, the encapsulating material is supplied onto the substrate by an exclusive-use dispenser. The semiconductor light-emitting devices and elements have various shapes depending on the purpose of use of the devices, so that the amount of supplied encapsulating material differs depending on the structure, the area, and the volume of the substrate, the element and the like, and in addition, the structure of the electrode, the wire interconnect or the like. The amount of supplied encapsulating material is preferably an amount capable of embedding these element, wire interconnect and the like and capable of setting the thickness of the encapsulating material which covers over the light-emitting element to be as small as possible, more preferably an amount which gives a thickness of 1 mm or less. It is effective to make the thickness on the light-emitting element be small because that tendency is conspicuous particularly in a power LED for visible light having a light emission output current of 100 mA or more, a UV-LED which emits ultraviolet rays having a wavelength of 350 nm or less and the like that are being increasingly developed in recent years.

In the present invention, the thickness of an element represents a height from the substrate to the upper end of the element. When the device has a wire interconnect, the thickness of the element is assumed to represent the height from the substrate to the wire interconnect.

The third step is a step of curing the uncured encapsulating material which has been potted in the second step. By curing the encapsulating material potted in a liquid form, the element is encapsulated without intervention of space, so that a loss of light extraction from the element by total reflection can be suppressed.

The formula (3) is preferably the following formula (3').

$$Abs_C(t) - Abs_A(t) < 0.09t \quad (3')$$

Also, when t is smaller than or equal to the thickness of the element, there is no effect of encapsulating, whereas when t is too large, the absorption of light increases, leading to decrease in the light extraction efficiency. Also, according as the thickness increases, cracks are more liable to be generated in the encapsulating material. Therefore, it is preferable that t exceeds the thickness [mm] of the element and is smaller than or equal to 2.

EXAMPLES

The devices and conditions used in the transmittance measurement and infrared spectroscopy measurement described in the following Examples are as follows.
<Transmittance Measurement>
  Device name: UV-3600 manufactured by Shimadzu Corporation
  Attachment: integrating sphere ISR-3100
  Measurement wavelength: 220 to 800 nm
  Background measurement: ambient atmosphere
  Measurement speed: middle speed
<Infrared Spectroscopy Measurement>
  Device name: 670 manufactured by VARIAN, INC.
  Attachment: GOLDEN GATE diamond ATR
  Measurement wavelength: 4000 to 700 cm$^{-1}$
  Background measurement: ambient atmosphere
  Number of integration times: 32 times Example 1

A resin composition was produced by using a resin (A-1) having an organopolysiloxane structure represented by the above formula (I) (Mw=3500, in the above formula (I), $R^1$=methyl group, $R^2$=methoxy group or hydroxyl group) as the resin A and an oligomer (B-1) having an organopolysiloxane structure represented by the above formula (II) (Mw=450, in the above formula (II), $R^1$=methyl group, $R^2$=methoxy group) as the oligomer B. The existence ratio of each of the repeating units of the resin (A-1) and the oligomer (B-1) is shown respectively in Tables 1 and 2.

TABLE 1

| Repeating unit | $\left(\begin{array}{c}OCH_3\\|\\-Si-O-\\|\\CH_3\end{array}\right)$ | $\left(\begin{array}{c}OH\\|\\-Si-O-\\|\\CH_3\end{array}\right)$ | $\left(\begin{array}{c}Si\\|\\O\\|\\-Si-O-\\|\\CH_3\end{array}\right)$ |
|---|---|---|---|
| Existence ratio | 0.08 | 0.15 | 0.77 |

TABLE 2

| Repeating unit | $\left(H_3CO-\begin{array}{c}OCH_3\\|\\Si-O-\\|\\CH_3\end{array}\right)$ | $\left(\begin{array}{c}OCH_3\\|\\-Si-O-\\|\\CH_3\end{array}\right)$ | $\left(\begin{array}{c}Si\\|\\O\\|\\-Si-O-\\|\\CH_3\end{array}\right)$ |
|---|---|---|---|
| Existence ratio | 0.39 | 0.49 | 0.12 |

With respect to the resin (A-1), the values of the formula (4) and the formula (5) were determined with the following result.

$$d/c = 0.636 \quad (4)$$

$$b/a = 0.153 \quad (5)$$

Specifically, 135 g of the resin (A-1) and 72.7 g of isopropyl alcohol were added into a flask which had been placed in a water bath. The mixture was heated and stirred until the inner temperature became 85° C., so as to dissolve the resin (A-1). Subsequently, 15 g of the oligomer (B-1) was added, and the resultant was stirred for no less than one hour to dissolve the oligomer (B-1), thereby obtaining a mixture.

To the obtained mixture, 47.2 g of 2-butoxyethyl acetate was added. Thereafter, with use of an evaporator, isopropyl alcohol was distilled off under conditions with a temperature of 80° C. and a pressure of 4 kPaA until the isopropyl alcohol concentration became 1% by mass or less, thereby yielding a silicone resin composition (α1) in which the mixing ratio of the resin (A-1) and the oligomer (B-1) was 90:10 (weight ratio).

To 100 parts by mass of the silicone resin composition (α1), 2 parts by mass of a catalyst for curing comprising 15 wt % of phosphoric acid was added, followed by stirring and mixing sufficiently, thereby producing a silicone resin composition (α1-1). Thereafter, about 3.8 g of the silicone resin composition (α1-1) was put into a cup made of aluminum. Further, the temperature was raised from room temperature up to 150° C. at a speed of 3.7° C./minute in an oven, and the resultant was left to stand at 150° C. for 5 hours, thereby producing a cured product of the silicone resin composition (α1-1). The thickness of the produced cured product was 1.7 mm. With regard to this cured product, it was found out that T(1.7)=92.3%, satisfying the formula (1).

Figure 3:
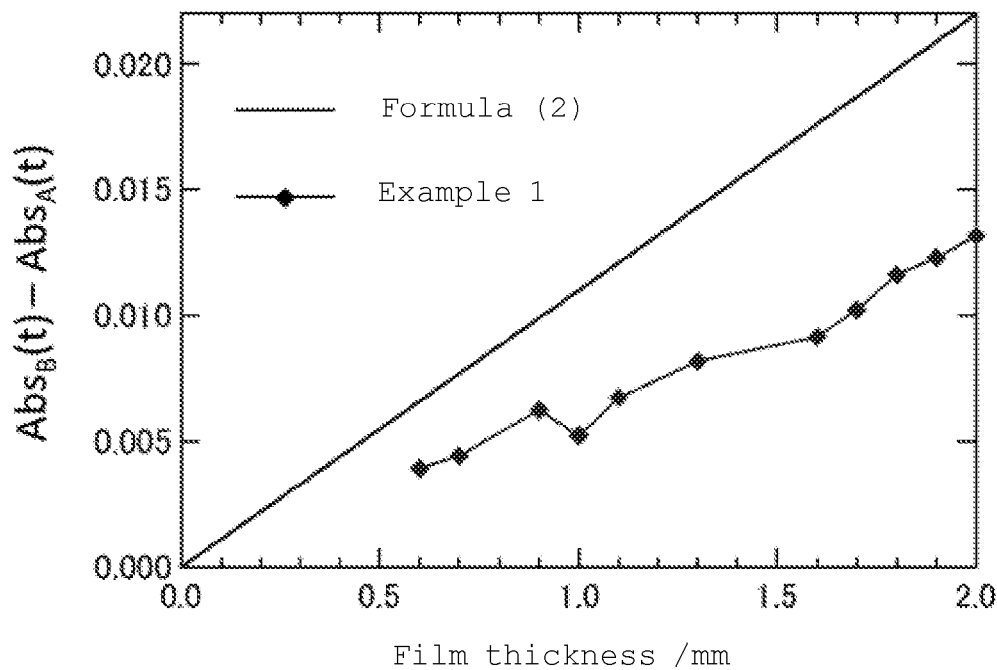
FIG. 3 is a graph showing a result of measuring $Abs_B(t) - Abs_A(t)$ of a cured product by changing the thickness t in the Examples.
Figure 4:
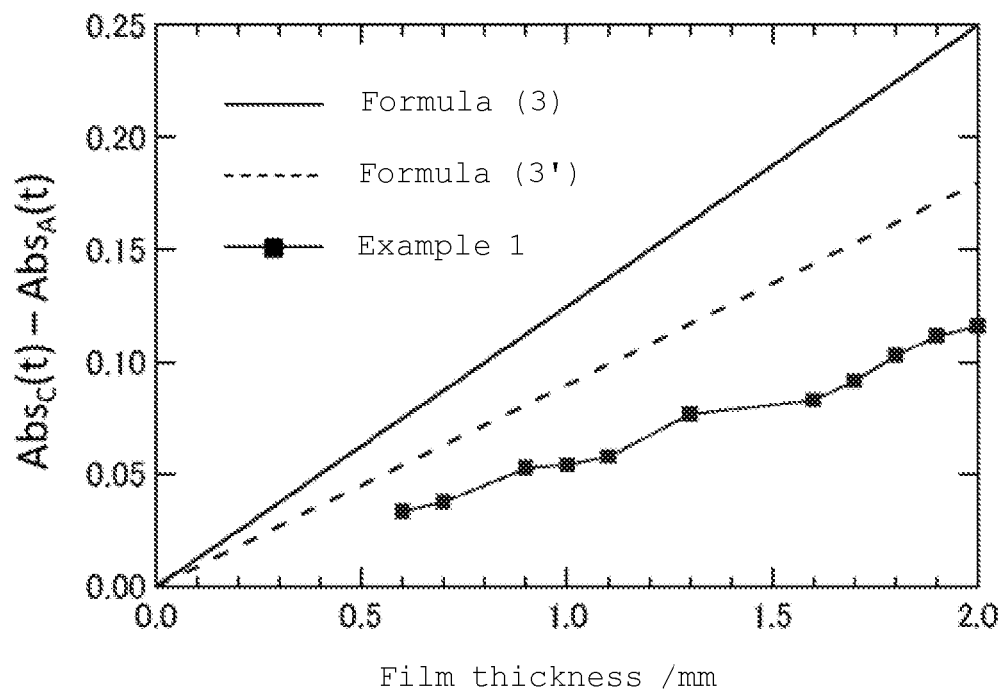
FIG. 4 is a graph showing a result of measuring $Abs_C(t)$–$Abs_A(t)$ of the cured product by changing the thickness t in the Examples.

Also, cured products of 0.6 mm to 2.0 mm were produced by changing the amount of the resin composition put into the aluminum cup, and the values of $Abs_B(t)-Abs_A(t)$ and $Abs_C(t)-Abs_A(t)$ were determined. The results are shown in FIGS. 3 and 4. As a result of this, it was found out that all of the produced cured products satisfied the relationship of the formula (2) and the formula (3).

The change in transmittance at the time when the cured product having a thickness of 1.7 mm was exposed in ambient atmosphere at 200° C. for 1000 hours was measured with the following result. Assuming that the transmittance before the test was 1, the transmittance was 0.98 or more in the range from 260 nm to 380 nm.

A semiconductor element which emits light of 275 nm was provided on a substrate provided with a reflector and a pair of positive and negative electrodes. After the silicone resin composition (α1-1) was potted thereto, the temperature was raised from room temperature up to 150° C. at a speed of 3.7° C./minute in an oven, and the resultant was left to stand at 150° C. for 5 hours, thereby fabricating a semiconductor element encapsulated with a cured product of the silicone resin composition (α1-1). The thickness t of the encapsulating material was 600 μm.

INDUSTRIAL APPLICABILITY

According to the producing method of the present invention, there can be produced a semiconductor light-emitting device exhibiting a good efficiency of extracting light in the ultraviolet range and causing little deterioration of an encapsulating material.

DESCRIPTION OF REFERENCE SIGNS

1 Encapsulating material
2 Substrate
3 Element
4 Electrode
5 Thickness of element [mm]
6 Thickness t of encapsulating material [mm]
7 Wire interconnect

The invention claimed is:

1. A method for producing a semiconductor light-emitting device comprising a substrate, an element and an encapsulating material as constituent members, the method comprising:
a first step of providing the substrate with the element;
a second step of potting an uncured encapsulating material onto the substrate to cover the element, the uncured encapsulating material comprising a resin A having an organopolysiloxane structure represented by the formula (I):

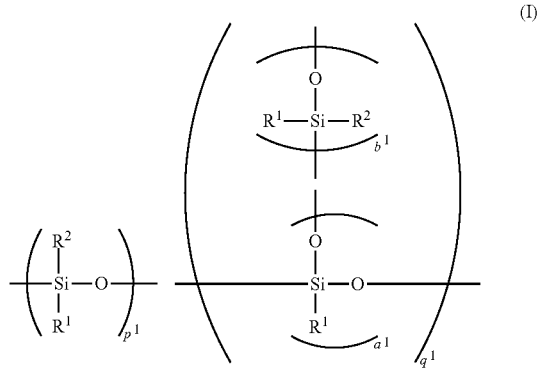

in the formula (I), $R^1$ each independently represents an alkyl group; $R^2$ each independently represents an alkoxy group or a hydroxyl group; and $p^1$, $q^1$, $a^1$ and $b^1$ represent positive numbers satisfying $[p^1+b^1\times q^1]:[a^1\times q^1]=1:0.25$ to 9; and
a third step of curing the potted encapsulating material in such a manner that all of the following formulae (1), (2) and (3) are satisfied when the absorbances which a cured encapsulating material having a thickness of t [mm] has at wavelengths of 380 nm, 316 nm and 260 nm are represented by $Abs_A(t)$, $Abs_B(t)$ and $Abs_C(t)$, respectively and the light transmittance thereof at 380 nm is represented by T(t):

$$T(1.7) \geq 90\% \tag{1}$$

$$Abs_B(t) - Abs_A(t) < 0.011t \tag{2}$$

$$Abs_C(t) - Abs_A(t) < 0.125t. \tag{3}$$

2. The producing method according to claim 1, wherein the formula (3) is the following formula (3'):

$$Abs_C(t) - Abs_A(t) < 0.09t. \tag{3'}$$

3. The producing method according to claim 1, wherein t exceeds the thickness [mm] of the element and is 2 or less mm.

4. The producing method according to claim 3, wherein t is 0.6 to 2 mm.

5. The producing method according to claim 1, wherein all of the following formulae (4) and (5) are satisfied when the absorbances detected in infrared-spectroscopically measuring a raw material contained in the uncured encapsulating material to be used in the second step at wavenumbers of 1269 $cm^{-1}$, 3300 $cm^{-1}$, 1016 $cm^{-1}$ and 1090 $cm^{-1}$ are represented by a, b, c and d, respectively:

$$0.6 < d/c < 0.8 \tag{4}$$

$$0 < b/a < 0.4. \tag{5}$$

6. A semiconductor light-emitting device produced by the producing method according to claim 1, wherein all of the following formulae (1), (2) and (3) are satisfied when the absorbances which a cured encapsulating material having a thickness of t [mm] has at wavelengths of 380 nm, 316 nm and 260 nm are represented by $Abs_A(t)$, $Abs_B(t)$ and $Abs_C(t)$, respectively and the light transmittance thereof at 380 nm is represented by T(t):

$$T(1.7) \geq 90\% \tag{1}$$

$$Abs_B(t) - Abs_A(t) < 0.011t \tag{2}$$

$$Abs_C(t) - Abs_A(t) < 0.125t. \tag{3}$$

7. The semiconductor light-emitting device according to claim 6, wherein the element is an element which emits light in the UV-C range.

* * * * *